United States Patent
Croft et al.

(10) Patent No.: US 9,059,351 B2
(45) Date of Patent: Jun. 16, 2015

(54) INTEGRATED DIODE ASSEMBLIES FOR PHOTOVOLTAIC MODULES

(75) Inventors: Steven Thomas Croft, Menlo Park, CA (US); Osman Ghandour, Morgan Hill, CA (US); Whitfield Gardner Halstead, Palo Alto, CA (US)

(73) Assignee: Apollo Precision (Fujian) Limited, Fujian (CN)

( * ) Notice: Subject to any disclaimer, the term of this patent is extended or adjusted under 35 U.S.C. 154(b) by 871 days.

(21) Appl. No.: 13/204,552

(22) Filed: Aug. 5, 2011

(65) Prior Publication Data

US 2011/0284052 A1 Nov. 24, 2011

Related U.S. Application Data

(63) Continuation-in-part of application No. 12/264,712, filed on Nov. 4, 2008, now Pat. No. 8,586,857.

(51) Int. Cl.
*H01L 31/042* (2014.01)
*H01L 31/05* (2014.01)

(52) U.S. Cl.
CPC ......... *H01L 31/0504* (2013.01); *Y10T 29/4913* (2015.01); *H01L 31/042* (2013.01); *H01L 31/0508* (2013.01); *Y02E 10/542* (2013.01)

(58) Field of Classification Search
CPC .............. H01L 31/0508; H01L 31/042; H01L 31/0504
USPC .......... 136/246, 244, 256, 293; 257/676, 692, 257/696, 712, 773, 779, 459, 443, E23.023, 257/E23.043, E23.047, E23.051, E23.101, 257/E23.07

See application file for complete search history.

(56) References Cited

U.S. PATENT DOCUMENTS 3,553,030 A 1/1971 Lebrun
4,577,051 A 3/1986 Hartman
(Continued)

FOREIGN PATENT DOCUMENTS

DE 2757301 A1 7/1979
EP 0177300 A2 4/1986
(Continued)

OTHER PUBLICATIONS

U.S. Appl. No. 12/121,602, Office Action mailed Mar. 26, 2010.
(Continued)

*Primary Examiner* — Golam Mowla
(74) *Attorney, Agent, or Firm* — Weaver Austin Villeneuve & Sampson LLP

(57) ABSTRACT

Provided are bypass diode assemblies for use in photovoltaic modules. Also provided are methods of fabricating such assemblies and a method of fabricating photovoltaic modules using such assemblies. A diode assembly may include an insulating strip, at least one lead-diode assembly having a diode and two leads, and at least two interconnecting conductors overlapping with and electrically contacting the leads of the lead-diode assembly. The insulating strip supports the lead-diode assembly and conductors and at least partially insulates these components from photovoltaic cells. Specifically, during module fabrication, the interconnecting conductors make electrical connections to the back sides of the cells through cutouts in the insulating strip. The electrical connections may be made to every cell in a row or a subset of selected cells in that row. In certain embodiments, the same interconnecting conductor is connected to two or more cells positioned in adjacent rows.

44 Claims, 10 Drawing Sheets

(56) References Cited

U.S. PATENT DOCUMENTS

| | | | |
|---|---|---|---|
| 4,609,770 A | 9/1986 | Nishiura et al. |
| 4,652,693 A | 3/1987 | Bar-On |
| 4,665,277 A | 5/1987 | Sah et al. |
| 4,694,117 A | 9/1987 | Friedrich et al. |
| 4,746,618 A | 5/1988 | Nath et al. |
| 5,280,133 A | 1/1994 | Nath |
| 5,330,583 A | 7/1994 | Asai et al. |
| 5,389,159 A | 2/1995 | Kataoka et al. |
| 5,391,235 A | 2/1995 | Inoue |
| 5,457,057 A | 10/1995 | Nath et al. |
| 5,474,621 A | 12/1995 | Barnard |
| 5,567,248 A | 10/1996 | Chung |
| 5,620,528 A | 4/1997 | Schade et al. |
| 5,626,688 A | 5/1997 | Probst et al. |
| 5,814,195 A | 9/1998 | Lehan et al. |
| 5,961,738 A | 10/1999 | Benton et al. |
| 5,990,415 A | 11/1999 | Green et al. |
| 6,013,870 A | 1/2000 | Psyk et al. |
| 6,020,555 A | 2/2000 | Garboushian et al. |
| 6,058,020 A | 5/2000 | Winterer et al. |
| 6,066,797 A | 5/2000 | Toyomura et al. |
| 6,103,970 A | 8/2000 | Kilmer et al. |
| 6,114,046 A | 9/2000 | Hanoka |
| 6,121,542 A | 9/2000 | Shiotsuka et al. |
| 6,144,046 A | 11/2000 | Hanaoka |
| 6,208,020 B1 | 3/2001 | Minamio et al. |
| 6,218,606 B1 | 4/2001 | Morizane |
| 6,231,732 B1 | 5/2001 | Hollars et al. |
| 6,248,948 B1 | 6/2001 | Nakagawa et al. |
| 6,274,804 B1 | 8/2001 | Psyk et al. |
| 6,307,755 B1 | 10/2001 | Williams et al. |
| 6,313,396 B1 | 11/2001 | Glenn |
| 6,326,540 B1 | 12/2001 | Kilmer et al. |
| 6,359,210 B2 | 3/2002 | Ho et al. |
| 6,365,010 B1 | 4/2002 | Hollars |
| 6,372,538 B1 | 4/2002 | Wendt et al. |
| 6,384,313 B2 | 5/2002 | Nakagawa et al. |
| 6,388,336 B1 | 5/2002 | Venkateshwaran et al. |
| 6,479,744 B1 | 11/2002 | Tsuzuki et al. |
| 6,488,824 B1 | 12/2002 | Hollars et al. |
| 6,545,211 B1 | 4/2003 | Mimura |
| 6,600,100 B2 | 7/2003 | Ho et al. |
| 6,617,508 B2 | 9/2003 | Kilmer et al. |
| 6,728,097 B2 | 4/2004 | Wada et al. |
| 6,974,976 B2 | 12/2005 | Hollars |
| 7,563,647 B2 | 7/2009 | Bathan et al. |
| 7,675,148 B2 | 3/2010 | Lim et al. |
| 7,901,996 B2 | 3/2011 | Bathan et al. |
| 7,906,837 B2 | 3/2011 | Cabahug et al. |
| 8,203,200 B2 | 6/2012 | Halstead et al. |
| 8,586,857 B2 | 11/2013 | Everson et al. |
| 8,697,980 B2 | 4/2014 | Paulson et al. |
| 2003/0193322 A1 | 10/2003 | Higashikozono |
| 2004/0069340 A1 | 4/2004 | Luch |
| 2005/0072461 A1 | 4/2005 | Kuchinski et al. |
| 2005/0109392 A1 | 5/2005 | Hollars |
| 2005/0133083 A1 | 6/2005 | Matsushita et al. |
| 2005/0156296 A1 | 7/2005 | Wang et al. |
| 2005/0176270 A1 | 8/2005 | Luch |
| 2005/0241692 A1 | 11/2005 | Rubin et al. |
| 2006/0032752 A1 | 2/2006 | Luch |
| 2006/0180195 A1 | 8/2006 | Luch |
| 2007/0052076 A1 | 3/2007 | Ramos et al. |
| 2007/0074755 A1 | 4/2007 | Eberspacher et al. |
| 2007/0132073 A1 | 6/2007 | Tiong et al. |
| 2007/0283996 A1 | 12/2007 | Hatchmann et al. |
| 2007/0283997 A1 | 12/2007 | Hatchmann et al. |
| 2008/0023064 A1 | 1/2008 | Hayes et al. |
| 2008/0041442 A1 | 2/2008 | Hanoka |
| 2008/0044946 A1 | 2/2008 | Cruz et al. |
| 2008/0135990 A1 | 6/2008 | Coyle et al. |
| 2008/0203549 A1 | 8/2008 | Chow et al. |
| 2008/0289682 A1 | 11/2008 | Adriani et al. |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0038683 A1 | 2/2009 | Walter et al. |
| 2009/0114261 A1 | 5/2009 | Stancel et al. |
| 2009/0283137 A1 | 11/2009 | Croft et al. |
| 2010/0108122 A1 | 5/2010 | Everson et al. |
| 2010/0193922 A1 | 8/2010 | Kastner et al. |
| 2011/0074007 A1 | 3/2011 | Lopez et al. |
| 2011/0121441 A1 | 5/2011 | Halstead et al. |
| 2011/0146778 A1 | 6/2011 | Croft et al. |
| 2011/0192448 A1 | 8/2011 | Croft et al. |
| 2011/0284052 A1 | 11/2011 | Croft et al. |

FOREIGN PATENT DOCUMENTS

| | | |
|---|---|---|
| EP | 1237186 | 9/2002 |
| EP | 2345072 | 7/2011 |
| JP | 06-252333 | 9/1994 |
| JP | 07-302923 | 11/1995 |
| JP | 11-330524 | 11/1999 |
| JP | 2000-216421 | 8/2000 |
| JP | 2000-269531 | 9/2000 |
| JP | 2000-277785 | 10/2000 |
| JP | 2001-135847 | 5/2001 |
| JP | 2001-298134 | 10/2001 |
| JP | 2001-339087 | 12/2001 |
| JP | 2002-026195 | 1/2002 |
| JP | 2002-151554 | 5/2002 |
| JP | 2002-158324 | 5/2002 |
| JP | 2003-110077 | 4/2003 |
| JP | 2003-197828 | 7/2003 |
| JP | 2004-253475 | 9/2004 |
| JP | 2005-129773 | 5/2005 |
| WO | 2008-124158 | 10/2008 |
| WO | 2008/150558 | 12/2008 |
| WO | 2008/156755 | 12/2008 |
| WO | 2009-076740 | 6/2009 |
| WO | 2009/140521 | 11/2009 |
| WO | 2010/053730 | 5/2010 |
| WO | 2011/066178 | 6/2011 |
| WO | 2011/087749 | 7/2011 |

OTHER PUBLICATIONS

U.S. Appl. No. 12/121,602, Office Action mailed Aug. 6, 2010.
U.S. Appl. No. 12/121,602, Office Action mailed May 9, 2012.
U.S. Appl. No. 13/084,297, Office Action mailed Nov. 15, 2012.
U.S. Appl. No. 13/084,297, Office Action mailed Jun. 6, 2013.
U.S. Appl. No. 13/084,297, Office Action mailed Nov. 18, 2013.
U.S. Appl. No. 13/084,297, Office Action mailed Apr. 2, 2014.
U.S. Appl. No. 12/264,712, Office Action mailed Jul. 28, 2011.
U.S. Appl. No. 12/264,712, Final Office Action mailed Jan. 6, 2012.
U.S. Appl. No. 12/264,712, Notice of Allowance mailed Jul. 18, 2013.
U.S. Appl. No. 12/626,281, Office Action mailed May 12, 2011.
U.S. Appl. No. 12/626,281, Final Office Action mailed Dec. 7, 2011.
U.S. Appl. No. 12/626,281, Notice of Allowance and Interview Summary mailed Feb. 21, 2012.
U.S. Appl. No. 11/812,515, Office Action mailed Oct. 12, 2010.
U.S. Appl. No. 11/812,515, Final Office Action mailed Apr. 14, 2011.
U.S. Appl. No. 11/812,515, Notice of Allowance mailed Dec. 10, 2013.
WO patent application No. PCT/US2009/043989, International Search Report and Written Opinion mailed Dec. 2, 2009.
International Preliminary Report on Patentability mailed Nov. 25, 2010, issued in PCT Application No. PCT/US2009/043989.
WO patent application No. PCT/US2009/062016, International Search Report and Written Opinion mailed May 20, 2010.
International Preliminary Report on Patentability mailed May 19, 2011, issued in PCT Application No. PCT/US2009/062016.
International Search Report and Written Opinion mailed Jul. 29, 2011, from PCT Application No. PCT/US2010/057327.

(56) References Cited

OTHER PUBLICATIONS

International Search Report and Written Opinion mailed Dec. 31, 2008, from PCT Application No. PCT/US2008/007531.
International Preliminary Report on Patentability mailed Dec. 22, 2009, from PCT Application No. PCT/US2008/007531.
Richards et al., "Enhancing the efficiency of production CdS/CdTe PV modules by overcoming poor spectral response at short wavelengths via luminescence downshifting," 2006 IEEE 4th World Conference on Photovoltaic Energy Conversion, May 7-12, 2006, 4 pages.
Untila et al., "19.2% Efficient Bifacial ITO-($P^+Nn^+$)Si-ITO Laminated Grid Cell," 16th European Photovoltaic Solar Energy Conference, May 1-5, 2000, Glasgow, UK, pp. 1489-1491.
JP patent publication No. 2001-339087, "Natural lighting type solar battery module and system thereof," published Dec. 7, 2001, machine translation.
JP patent publication No. 11-330524, "Solar Battery Panel," published Nov. 30, 1999, machine translation.
U.S. Appl. No. 13/084,297, Office Action mailed Aug. 27, 2014.
U.S. Appl. No. 13/084,297, Notice of Allowance mailed Jan. 5, 2015.

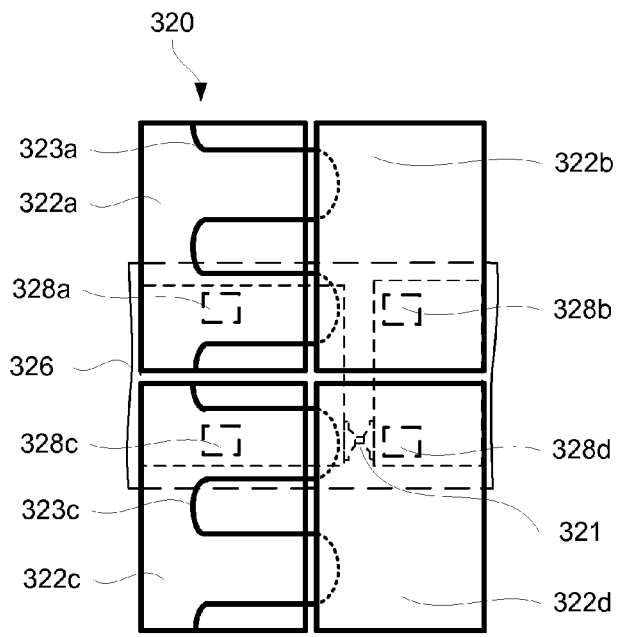
FIG. 3C
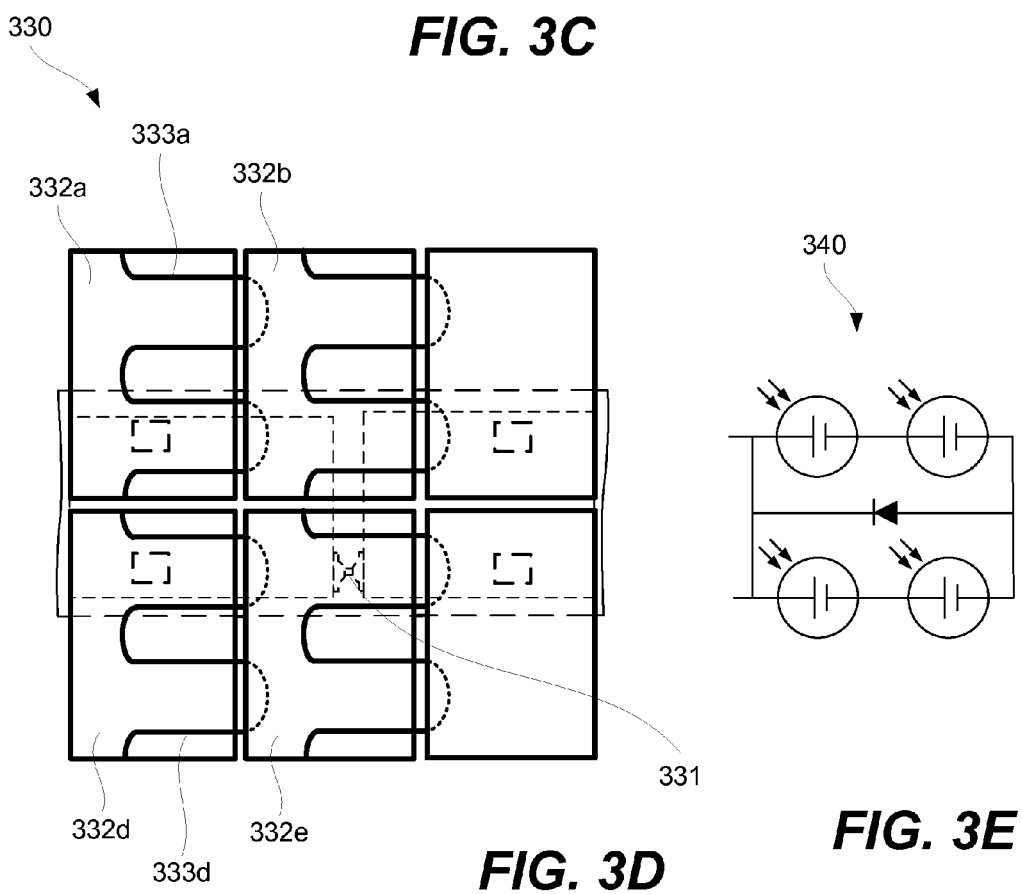
FIG. 3D
FIG. 3E

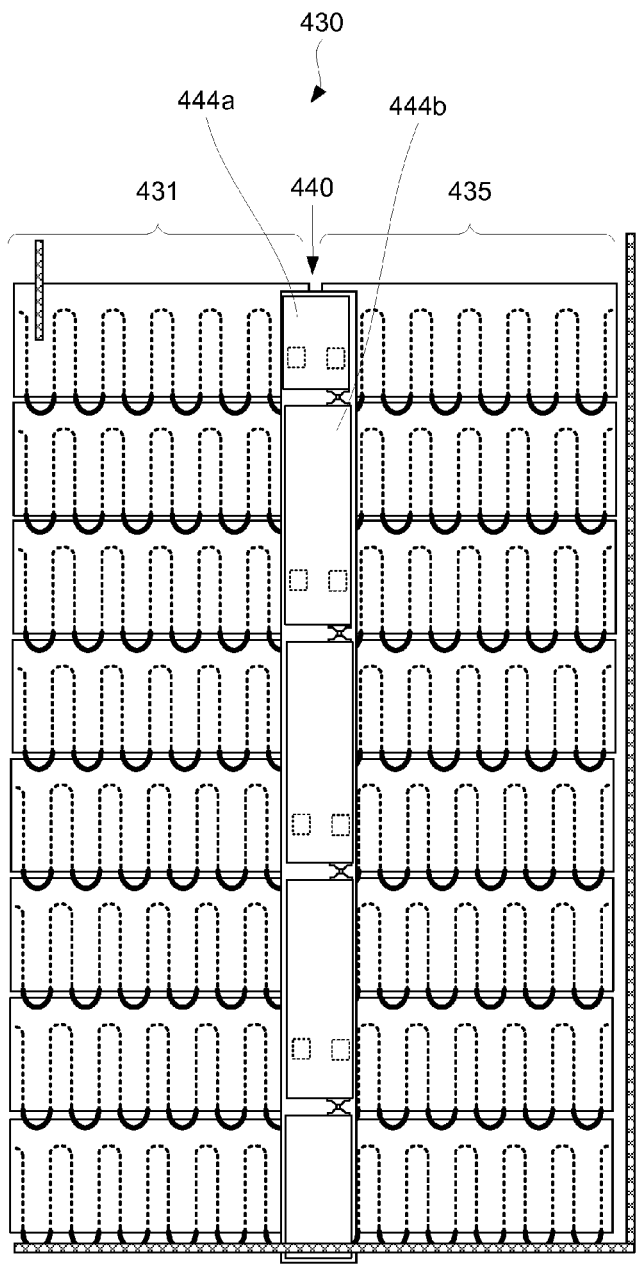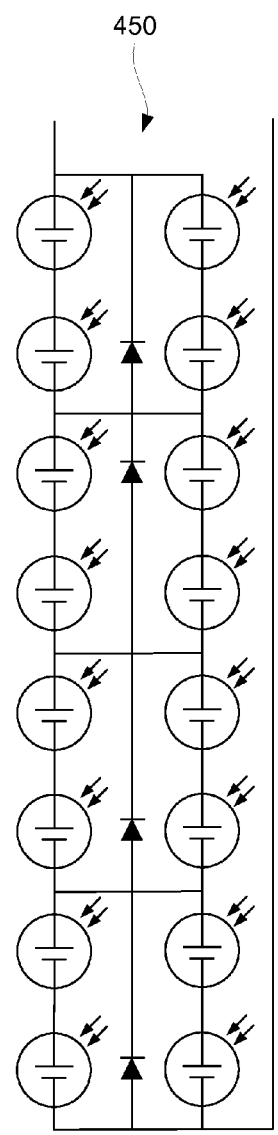
*FIG. 4C*  *FIG. 4D*

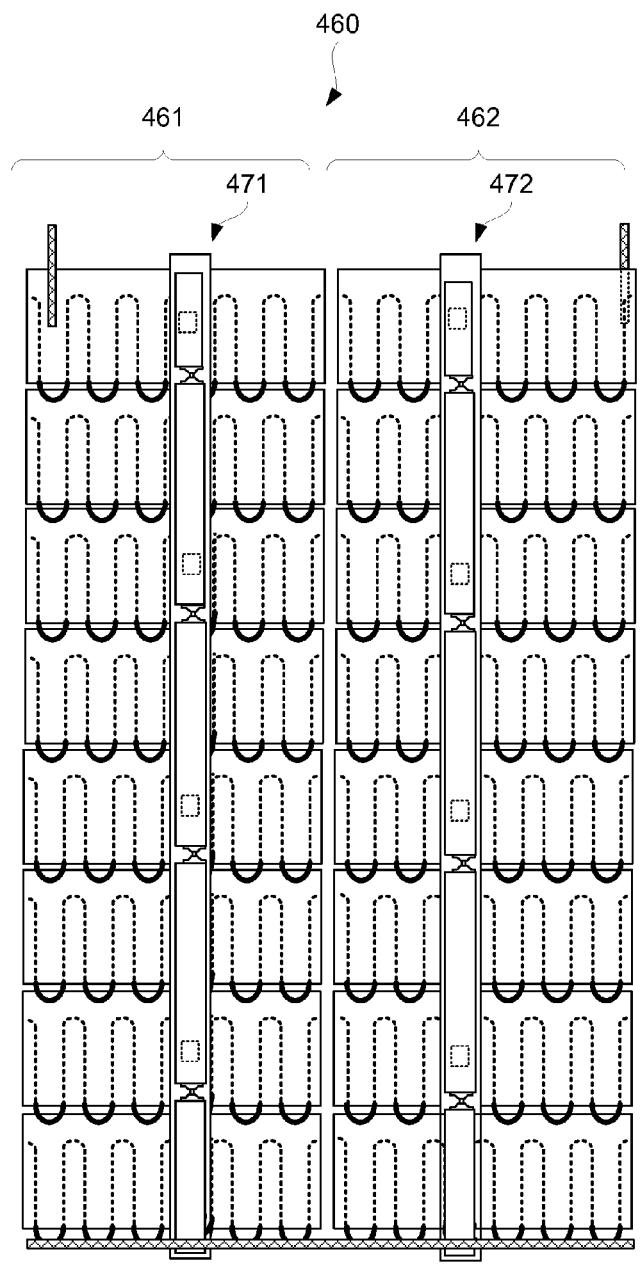
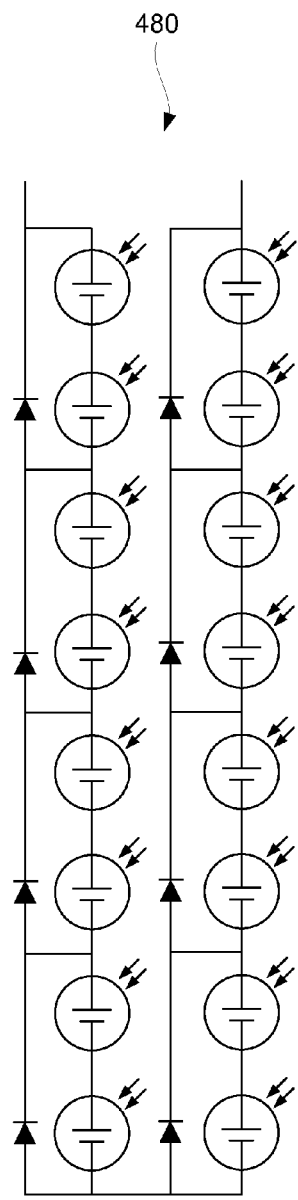
FIG. 4E
FIG. 4F

INTEGRATED DIODE ASSEMBLIES FOR PHOTOVOLTAIC MODULES

CROSS-REFERENCE TO RELATED APPLICATIONS

This application is a continuation-in-part of U.S. patent application Ser. No. 12/264,712, entitled "COMBINED DIODE, LEAD ASSEMBLY INCORPORATING AN EXPANSION JOINT," filed Nov. 4, 2008, which is incorporated by reference herein in its entirety for all purposes.

BACKGROUND

Photovoltaic cells are widely used for the generation of electricity, with multiple photovoltaic cells interconnected in module assemblies. Such modules may in turn be arranged in arrays and integrated into building structures or otherwise assembled to convert solar energy into electricity by the photovoltaic effect. An example of photovoltaic cells includes copper indium gallium diselenide (CIGS) cells, which offer great promise for thin film photovoltaic applications having high efficiency and low cost.

Manufacturing photovoltaic cells and, in particular, thin film photovoltaic cells, may cause some small defects, which generally do not impact cell performance if properly addressed and maintained. For example, some imperfections and contamination in a relatively thin photovoltaic layer may create an area having low electrical resistance that may, in turn, cause electrical shorts and localized heating. These defects are referred to as shunt defects. Bypass diodes have been used to overcome the impact of such shunt defects that cause power loss in photovoltaic cells and help to maintain the reliability and efficiency of photovoltaic cells when protected by such bypass diodes.

SUMMARY

Provided are bypass diode assemblies for use in photovoltaic modules. Also provided are methods of fabricating such assemblies and a method of fabricating photovoltaic modules using such assemblies. A diode assembly may include an insulating strip, at least one lead-diode assembly having a diode and two leads, and at least two interconnecting conductors overlapping with and electrically contacting the leads of the lead-diode assembly. The insulating strip supports the lead-diode assembly and conductors and at least partially insulates these components from photovoltaic cells. Specifically, during module fabrication, the interconnecting conductors make electrical connections to the back sides of the cells through cutouts in the insulating strip. The electrical connections may be made to every cell in a row or a subset of selected cells in that row (e.g., skipping one or more cells). In certain embodiments, the same interconnecting conductor is connected to two or more cells positioned in adjacent rows.

In certain embodiments, an integrated diode assembly for providing electrical protection to one or more photovoltaic cells in a photovoltaic module includes an insulating strip having a first surface, a second surface, and a first cutout, a first combined diode-lead assembly disposed adjacent to the second surface, and a first interconnecting conductor disposed adjacent to the second surface. The first combined diode-lead assembly may include a first diode, a first diode conductor electrically connected to one electrical lead of the first diode, and a second diode conductor electrically connected another electrical lead of the first diode. The first interconnecting conductor at least partially overlapping and being electrically connected to the first diode conductor. One or more of the first interconnecting conductor and the first diode conductor at least partially overlap the first cutout to provide an electrical connection to a first photovoltaic cell disposed adjacent to the first surface.

In certain embodiments, one or more of the first interconnecting conductor and the first diode conductor at least partially overlap the first cutout to provide an electrical connection to a second photovoltaic cell disposed adjacent to the first surface and to the first photovoltaic cell. In the same or other embodiments, the insulating strip includes a second cutout at least partially overlapped by one or more of the first interconnecting conductor and the first diode conductor to provide an electrical connection to a second photovoltaic cell disposed adjacent to the first surface of the insulating strip and to the first photovoltaic cells. An integrated diode assembly may include a second interconnecting conductor disposed adjacent to the second surface. The second interconnecting conductor at least partially overlaps and is electrically connected to the second diode conductor. In these embodiments, the second interconnecting conductor, or the second diode conductor, or both at least partially overlap a second cutout provided on the insulating strip to provide an electrical connection to a second photovoltaic cell disposed adjacent to the first surface. The distance between the first cutout and the second cutout may be such that the first photovoltaic cell is adjacent to the second photovoltaic cell. In other embodiments, the distance between the first cutout and the second cutout is such that the first photovoltaic cell is separated by at least one other photovoltaic cell from the second photovoltaic cell. The first diode-lead assembly may be positioned between the first cutout and the second cutout.

In certain embodiments, an integrated diode assembly may include a second combined diode-lead assembly disposed adjacent to the second surface of the insulating strip. The second diode-lead assembly includes a second diode, a third diode conductor electrically connected to one electrical lead of the second diode, and a forth diode conductor electrically connected to another electrical lead of the second diode. The first interconnecting conductor at least partially overlaps and is electrically connected to the fourth diode conductor. In the same or other embodiments, the insulating strip comprises a folding cut portion formed by the first cutout. The folding portion is attached to an opposite surface of the interconnecting conductor with respect to the first cutout.

In certain embodiments, an electrical connection between the first diode conductor and the first diode includes an expansion joint configured to reduce stress applied to the first diode. The expansion joint is configured to provide a sliding contact in communication with the interconnecting conductor. In certain embodiments, an insulating strip includes an adhesive layer provided on the second surface. The adhesive layer may be configured to provide mechanical support to the first combined diode-lead assembly and/or to the first interconnecting conductor. The adhesive layer may include one or more of the following adhesive materials: a pressure sensitive adhesive and a hot-melt adhesive. In certain embodiments, the insulating strip may include a second adhesive layer provided on the first surface, the first adhesive layer configured to attach to a back side of the first photovoltaic cell.

Provided also a photovoltaic module that includes a first row of photovoltaic cells interconnected in series and an integrated diode assembly provided adjacent to and overlapping with the first row of photovoltaic cells. The first row includes a first photovoltaic cell and a second photovoltaic cell. The integrated diode assembly includes an insulating strip having a first cutout aligned with the first photovoltaic cell and a second cutout aligned with the second photovoltaic cell. The integrated diode assembly also includes a first combined diode-lead assembly provided adjacent to an opposite side of the insulating strip with respect to the first row of photovoltaic cells. The first diode-lead assembly includes a first diode, a first diode conductor electrically connected to one electrical lead of the first diode and to a back side of the first photovoltaic cell and a second diode conductor electrically connected to another electrical lead of the first diode and to a back side of the second photovoltaic cell.

In certain embodiments, a photovoltaic module also includes a first interconnecting conductor disposed adjacent to the opposite side of the insulating strip with respect to the first row of photovoltaic cells. The first interconnecting conductor at least partially overlaps with the first cutout and is electrically connected to the back side of the first photovoltaic cell either directly or through the first diode conductor. The first interconnecting conductor at least partially overlaps the first diode conductor and is electrically connected to the first diode conductor.

In certain embodiments, a photovoltaic module also includes a second interconnecting conductor disposed adjacent to the opposite side of the insulating strip with respect to the first row of photovoltaic cells. The second interconnecting conductor at least partially overlaps with the second cutout and is electrically connected to the back side of the second photovoltaic cell either directly or through the second diode conductor. The second interconnecting conductor at least partially overlaps the second diode conductor and is electrically connected to the second diode conductor. The first photovoltaic cell is adjacent to the second photovoltaic cell in the first row. The first photovoltaic cell is separated from the second photovoltaic cell by at least one other photovoltaic cell in the first row.

In certain embodiments, a photovoltaic module also includes a second row of photovoltaic cells interconnected in series. The second row includes a third photovoltaic cell and fourth photovoltaic cell such that the back side of the third photovoltaic cell is electrically connected to the first diode conductor. At the same time, the back side of the fourth photovoltaic cell is electrically connected to the second diode conductor. The integrated diode assembly may be provided adjacent to and overlaps with the second row of photovoltaic cells. For example, the back side of the third cell may overlap with the first cutout.

In certain embodiments, the back side of the third cell overlaps with a third cutout provided in the insulating strip. A first interconnecting conductor may be disposed adjacent to the opposite side of the insulating strip with respect to the first row of photovoltaic cells and with respect to the second row of photovoltaic cells. The first interconnecting conductor and/or the first diode conductor at least partially overlap with the first cutout and are electrically connected to the back side of the first photovoltaic cell. Furthermore, the first interconnecting conductor and/or the first diode conductor at least partially overlap with the third cutout and are electrically connected to the back side of the third photovoltaic cell. The first interconnecting conductor at least partially overlaps the first conductor of the first combined diode-lead assembly and is electrically connected to the first conductor. In certain embodiments, the first photovoltaic cell is separated from the second photovoltaic cell by at least one other photovoltaic cell in the first row. The third photovoltaic cell may be likewise separated from the fourth photovoltaic cell by at least one other photovoltaic cell in the second row.

In certain embodiments, an insulating strip is adhered to the back side of the first photovoltaic cell and to the back side of the second photovoltaic cell. In the same or other embodiments, a photovoltaic module also includes a back side insulating sheet. The integrated diode assembly is positioned between the first row of photovoltaic cells and the back side insulating sheet. A photovoltaic module may also include a bus bar connected to the first diode conductor.

Provided also a photovoltaic module including one or more rows of photovoltaic cells interconnected in series in each row and an integrated diode assembly provided adjacent to and overlapping with the one or more rows of photovoltaic cells. The integrated diode assembly may include a diode, a first diode conductor electrically connected to one electrical lead of the diode and to a back side of a first photovoltaic cell in one of these rows, and a second diode conductor electrically connected to another electrical lead of the diode and to a back side of a second photovoltaic cell. Electrical connections between the first photovoltaic cell and the second photovoltaic cell connect a set of multiple photovoltaic cells in parallel with the first diode.

Provided also a method of fabricating an integrated diode assembly for electrical coupling to multiple photovoltaic cells. The method may involve providing an insulating strip having a surface and attaching a first combined diode-lead assembly to the surface. The first diode-lead assembly may include a first diode, a first diode conductor electrically connected to one electrical lead of the first diode, and a second diode conductor electrically connected another electrical lead of the first diode. The method may also involve attaching a first interconnecting conductor to the surface of the insulating strip such that the first interconnecting conductor at least partially overlaps the first diode conductor and electrically connects to the first diode conductor.

In certain embodiments, prior to attaching the first interconnecting conductor to the insulating sheet, the method also involves forming one or more cutouts in the insulating strip such that the first interconnecting conductor and/or the first diode conductor at least partially overlaps the one or more cutouts after attaching the first interconnecting conductor to the insulating sheet. The method may also involve folding one or more cut portions over the first interconnecting conductor and attaching the folded one or more cut portions to the first interconnecting conductor such that the one or more cut portions are formed during forming the one or more cutouts in the insulating strip. In certain embodiments, the method may also involve attaching one or more cut portions to the first interconnecting conductor comprises heating the first interconnecting conductor. Attaching the first interconnecting conductor may involve forming an electrical connection between the first diode conductor and a third diode conductor of a second combined diode-lead assembly attached to the surface of the insulating strip by overlapping the first interconnecting conductor with the third diode conductor.

In certain embodiments, attaching the first interconnecting conductor involves localized heating of a portion of the first interconnecting conductor to modify the surface of the insulated strip. The surface of the insulated strip may include an adhesive material that increased its tackiness characteristics when heated through the first interconnecting conductor. In certain embodiments, a method also involves cutting the insulated strip along its width to separate the integrated diode assembly from one or more other integrated diode assemblies. In the same or other embodiments, a method also involves attaching a second combined diode-lead assembly to the surface and attaching a second interconnecting conductor to the surface such that the second interconnecting conductor at least partially overlaps the first diode conductor and electrically connects the first diode conductor to the second combined diode-lead assembly.

Provided also a method of fabricating a photovoltaic module that involves providing an aligned row of photovoltaic cells interconnected in series and positioning an integrated diode assembly over the aligned row of photovoltaic cells. The aligned row includes a first photovoltaic cell and a second photovoltaic cell. The integrated diode assembly includes a combined diode-lead assembly and an insulating strip positioned in between the combined diode-lead assembly and the aligned row of photovoltaic cells. The diode-lead assembly includes a first diode, a first diode conductor electrically connected to one electrical lead of the first diode and to a back side of the first photovoltaic cell, and a second diode conductor electrically connected to another electrical lead of the first diode and to a back side of the second photovoltaic cell. In certain embodiments, the first photovoltaic cell is separated from the second photovoltaic cell by at least one or more other photovoltaic cells in the aligned row. The method may also involve bonding the insulating strip to the back side of the first photovoltaic cell and the back side of the second photovoltaic cell. Such bonding may involve applying pressure and/or heat between the back side of the first photovoltaic cell and the back side of the second photovoltaic cell. Bonding may preserve alignment of the first photovoltaic cell with respect to the second photovoltaic cell during one of more subsequent operations, such as during lamination of the module assembly. In certain embodiments, a method also involves electrically connecting the first diode conductor to a bus bar of the photovoltaic module.

These and other embodiments are described further below with reference to the figures.

BRIEF DESCRIPTION OF THE DRAWINGS

FIG. 3C illustrates a top schematic view of a photovoltaic module portion having four photovoltaic cells arranged in two rows, such that the two left cells and a diode are connected in parallel, in accordance with certain embodiments.

FIG. 3D illustrates a top schematic view of a photovoltaic module portion having six photovoltaic cells arranged in two rows, such that the four left cells form two sets that are connected in parallel with each other and a diode, each set having two cells connected in series, in accordance with certain embodiments.

FIG. 3E is an electrical diagram corresponding to the module portion illustrated in FIG. 3D.

FIG. 4C illustrates a bottom schematic view of another photovoltaic module, in which two rows of cells are connected to one integrated diode assembly, in accordance with different embodiments.

FIG. 4D is an electrical diagram corresponding to the module illustrated in FIG. 4C.

FIG. 4E illustrates a bottom schematic view of a photovoltaic module having two rows of cells, in which each row is connected to a separate integrated diode assembly, in accordance with different embodiments.

FIG. 4F is an electrical diagram corresponding to the module illustrated in FIG. 4E.

DETAILED DESCRIPTION

Figure 1:
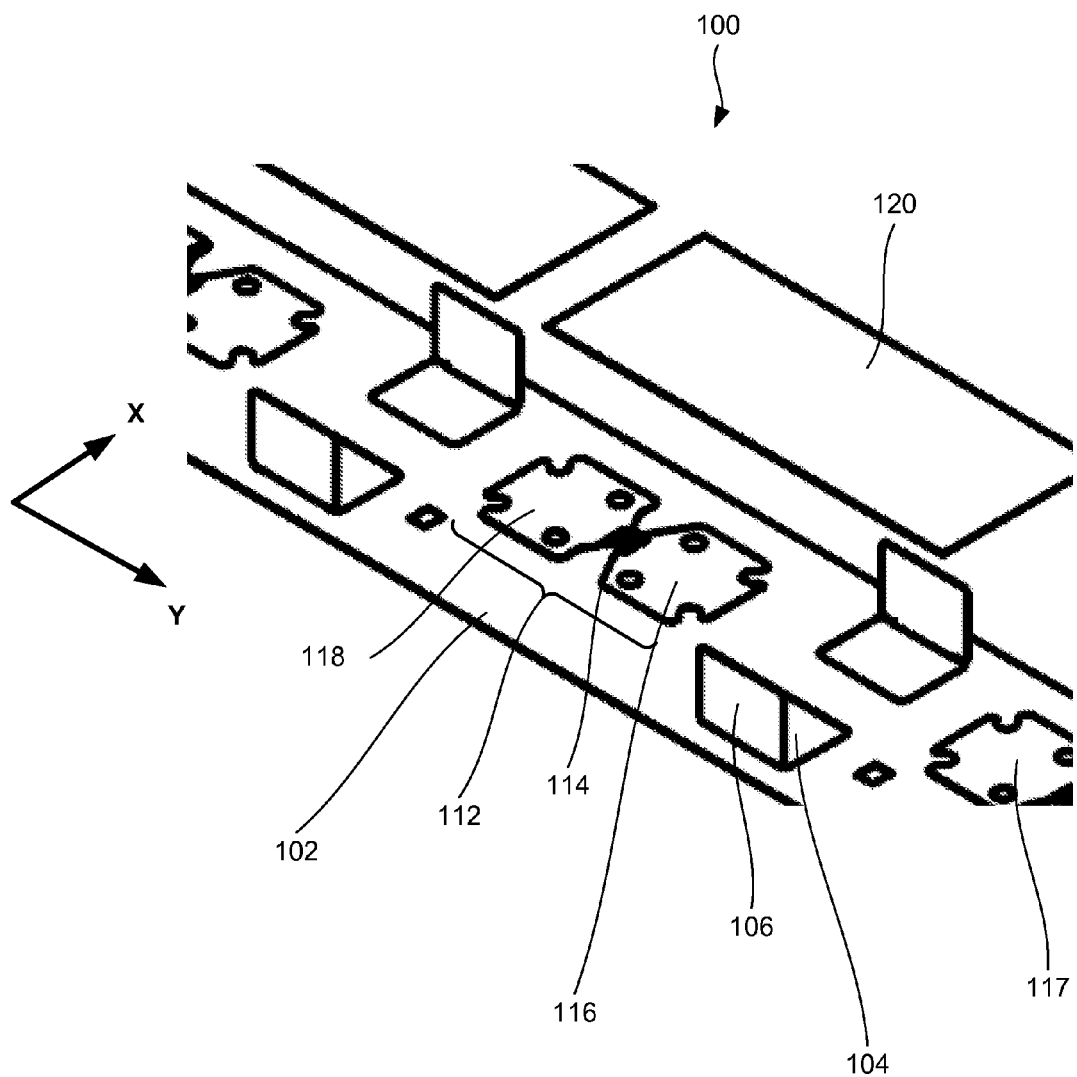
FIG. 1 illustrates a perspective view of an integrated diode assembly prior to positioning interconnecting conductors onto an insulating strip and combined diode-lead assemblies, in accordance with certain embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Thin film photovoltaic cells are typically assembled into a module and electrically interconnected with each other. These cells can be subjected to extreme biasing conditions if some cells are shaded, while other cells (in the same module) are still exposed to sunlight and continue to generate electrical power corresponding to an operating voltage. Small shunts caused by various cell defects may be paths of low electrical resistance in the shaded cells, which can cause large electrical currents through the shunts and associated heating. Some large shunts are visible or otherwise detectable and can be screened out using various inspection methods; however, smaller shunts may not be easily detectable. For example, some shunts may be hidden within the photovoltaic layer. These shunts may not cause major negative consequences when subjected to low voltages, such as some operating voltages of the cell. However, the same shunts may destroy the cell due to electrical current drain and heating, as explained above, when subjected to higher voltages, such as the reverse bias caused by partial shading of the module.

Cells may be protected from these phenomena by connecting one or more cells in parallel to a diode. This diode is often referred to as a biasing diode because of its ability to protect the cells from being exposed to an excessive reverse bias voltage. The diode allows an electrical current to flow through the diode, upon reaching a certain voltage potential, instead of flowing through the shunts which causes heating and, possibly, cell failure. As such, the diode limits the reverse voltage to which the cell and its shunts are exposed.

A diode may be provided as a part of an integrated diode assembly, which becomes a part of the module. The integrated diode assembly may include other components for making electrical connections to the diode and for providing mechanical support, such as an insulating strip and an interconnecting conductor. The integrated diode assembly may be used for making electrical connections with, and protecting, various types of thin film photovoltaic cells, such as amorphous silicon (a-Si), cadmium telluride (CdTe), copper indium gallium selenide (CIGS), dye-sensitized solar cell (DSC), and organic cells. Some examples of such photovoltaic cells and corresponding modules are described in U.S. patent application Ser. No. 12/272,600, filed on Nov. 17, 2008, entitled "Power-Loss-Inhibiting Current-Collectors," which is incorporated by reference herein.

Various integrated diode assembly and module configurations are provided herein that utilize one diode for protecting one or more cells. Connecting multiple cells to a single diode helps to reduce overall materials and manufacturing costs and adds additional flexibility to cell and module designs, such as using smaller photovoltaic cells. When multiple cells are protected by one diode, the cells may form one or more sets of cells, such that each set is connected in parallel with the diode. Cells in each one of these sets may be connected in parallel and/or in series in various combinations of these two interconnecting schemes. For example, a diode may be used to protect four cells that form two sets. Each set has a pair of cells connected in series, while both sets are connected in parallel with each other and the diode.

The number of cells protected by a single diode and their respective connection schemes in the sets depend on various factors, such as current ratings of the cells (typically driven by their cell sizes), reverse voltage ratings (typically corresponding to the cell quality), and various other factors. For example, when too many large photovoltaic cells or sets of cells are connected in parallel with one diode, the current may be too high for this diode. Connecting multiple cells to one diode can be challenging. For example, a failed diode may expose cells to an excessive current caused by a voltage/current imbalanced system. The contact and line resistance, as well as insulation between various components of the integrated diode assembly, need to be carefully designed and maintained to prevent any such problems.

Integrated Diode Assembly Structure

FIG. 1 illustrates a perspective view an integrated diode assembly 100 prior to positioning interconnecting conductors 120 onto an insulating strip 102 and combined diode-lead assemblies 112, in accordance with certain embodiments. To provide references to integrated diode assembly 100, two directions are identified in the drawing. The Y direction corresponds to the length of integrated diode assembly 100, while the X direction corresponds to its width. It should be noted that FIG. 1 illustrates only a portion of integrated diode assembly 100 along its length. Integrated diode assembly 100 may include additional combined diode-assemblies 112 and interconnecting conductors 120 disposed along its length. In certain embodiments, integrated diode assembly 100 has at least 5 combined diode-assemblies or, more specifically, at least 10 combined diode-assemblies or even at least 20 combined diode-assemblies.

In certain embodiments, integrated diode assembly 100 may first be a part of a subassembly of multiple integrated diode assemblies arranged along the Y direction and/or along the X direction. Integrated diode assembly 100 is then formed by cutting this subassembly along its length and/or along its width. In certain embodiments, such a subassembly forms a continuous roll.

Integrated diode assembly 100 includes an insulating strip 102, which is used for insulating electrical components disposed adjacent to one side of insulating strip 102 from photovoltaic cells disposed adjacent to the other side of insulating strip 102 during assembly of a photovoltaic module. Cutouts 104 are provided in insulating strip 102 for making electrical connections between electrical components of integrated diode assembly 100 and photovoltaic cells or, more specifically, between interconnecting conductors 120 of integrated diode assembly 100 and back substrate sides of the photovoltaic cells. These electrical connections are described below in more details. Insulating strip 102 is also used for mechanical support of other components of integrated diode assembly 100 during fabrication of integrated diode assembly 100, as well as during fabrication of a module and even during later operation of the module.

One or both surfaces of insulating strip 102 may adhere to various components of integrated diode assembly 100 and module. Such adhesion may be used to provide mechanical support, preserve alignment of the components (necessary for maintaining electrical connections), and prevent gaps and delamination in the module (necessary to avoid moisture and losses of electrical connections in the module). One surface of insulating strip 102 facing the photovoltaic cells during assembly of the module is referred to herein as a first surface, while the other surface facing various components of integrated diode assembly 100 is referred to as a second surface. The first surface also faces towards the front light incident side of the module and, therefore, may be referred to as a top surface, while the second surface may be referred to as a bottom surface.

The first surface is used for attaching integrated diode assembly 100 to back substrate sides of the cells, which may be a stainless steel foil or any other similar material. The first surface may be configured to form adhesive bonds to these materials. For example, various thermoplastic and pressure sensitive adhesive (PSA) materials listed below may be used to form the first surface. The first surface may also be positioned over interconnecting wire networks, such as serpentine-shaped wires, extending over small portions of the back substrate sides. This interconnecting wire network may cause the surface of the cell arrangement to be uneven (i.e., have some topography). As such, insulating strip 102 and, in certain embodiments, the entire integrated diode assembly 100 may be sufficiently flexible to form electrical and mechanical connections to such surface. Furthermore, insulating strip 102 may have a multilayered structure, and the layer forming the first surface may be sufficiently thick and flowable (at certain processing conditions) to fill the voids between the integrated diode assembly 100 and back substrate sides of the cells.

The second surface of insulating strip 102 is used for supporting various components of integrated diode assembly 100, such as combined diode-lead assemblies 112 and interconnecting conductors 120. These components may be made from various conductive materials, such as copper, copper plated with tin, tin, or nickel. The second surface may be formed by a material that is configured for attachment to these components. For example, various thermoplastic and PSA materials listed below may be used.

In certain embodiments, insulating strip 102 includes a liner. Some examples of the liner material include polyethylene terephthalate (PET), polyethylene naphthalate (PEN), poly(ethylene-co-tetrafluoroethylene) (EWE), ionomer resins (e.g., poly(ethylene-co-methacrylic acid)), polyamide, polyetherimide (PEI), polyetheretherketone (PEEK), and various combinations thereof. The liner may have one or more adhesive layers disposed on one or both sides of the liner, such as SURLYN®, available from E. I. du Pont de Nemours and Company in Wilmington, Del. For example, a support structure may have three polymer layers, such as a co-extruded stack containing SURLYN®, PET, and another layer of SURLYN® (with the PET layer positioned in between the two SURLYN® layers).

Insulating strip 102 may be made from various thermoplastic materials that allow localized heating and attaching of these materials to various other components of integrated diode assembly 100 and photovoltaic cells. Some examples include ionomers, acrylates, acid modified polyolefins, anhydride modified polyolefins, polyimides, polyamides, and various cross-linkable thermoplastics. More specific examples include BYNEL® resins supplied by DuPont in Wilmington, Del. For example, the following may be used: Series 1100 acid-modified ethylene vinyl acetate (EVA) resins, Series 2000 acid-modified ethylene acrylate polymers, Series 2100 anhydride-modified ethylene acrylate copolymers, Series 3000 anhydride-modified EVA copolymers, Series 3100 acid- and acrylate-modified EVA resins (which provide a higher degree of bond strength that Series 1100 resins), Series 3800 anhydride-modified EVA copolymers (with a higher level of vinyl acetate in the EVA component than the 3000 and 3900 series), Series 3900 anhydride-modified EVA resins (with an improved level of bonding to polyamides and EVOH), Series 4000 anhydride-modified high density polyethylene resins (HDPE) resins, Series 4100 anhydride-modified linear low density polyethylene (LLDPE) resins, Series 4200 anhydride-modified low density polyethylene (LDPE) resins, and Series 5000 anhydride-modified polypropylene (PP) resins. Another specific example includes JET-MELT® Polyolefin Bonding Adhesive 3731 supplied by 3M Engineered Adhesives Division in St. Paul, Minn. Some of these resins can be mixed with other resins or fillers, such as polypropylene and polystyrene resins, as well as various ionomers, in order to adjust their thermal stability, viscosity of the molten state during fabrication, and adhesion properties.

To provide electrical connections between conductive components of integrated diode assembly 100, such as interconnecting conductors 120, and photovoltaic cells, insulating strip 102 includes multiple cutouts 104. Specifically, cutouts 104 allow interconnecting conductors 120 disposed adjacent to the second surface to touch the back sides of the cells disposed adjacent to the first surface. Multiple cutouts 104 are provided along the length of integrated diode assembly 100 (the Y direction) to make connections to different cells positioned in the same row. As further explained below, the cells of the same row are typically interconnected in series. In certain embodiments, two or more cutouts 104 are provided along the width of integrated diode assembly 100 (the X direction) to make connections to different cells positioned in different rows. For example, two cutouts 104 are shown next to each other (along the X direction) in FIG. 1. Such cutouts may overlap the same interconnecting conductor. In this case, the two back sides of the cells overlapping the cutouts are connected in parallel with each other.

Dimensions of cutouts determine the contact area between interconnecting conductors and the back sides of the photovoltaic cells. It has been found that a suitable contact area for a typical photovoltaic cell producing about 3 A can be at least about 30 millimeters square. This value takes into consideration typical materials of the cell substrate and interconnecting conductors, as well as typical pressure provided in the module after its lamination. It should be noted that the same cutout may be used to form electrical connections to multiple cells as further explained below. Therefore, references should be generally made to contact areas rather than cutout areas or to a cutout area corresponding to one cell. In certain embodiments, a cutout area corresponding to one cell is at least about 50 millimeters square or, more specifically, at least about 100 millimeters square (e.g., 140-150 millimeters square).

In certain embodiments, multiple photovoltaic cells are connected to the same interconnecting conductor. For example, two cells may be positioned in adjacent rows that are overlapped by the same integrated diode assemblies or, more specifically in some embodiments, by the same interconnecting conductor. These multiple connections may be accomplished through one shared cutout in the insulating strip or multiple cutouts. FIG. 1 illustrates an example of integrated diode assembly 100 with multiple cutouts, more specifically with two cutouts positioned adjacent to each other along the width (the X direction). A portion of the insulating strip 102 in between cutouts 104 may help to provide additional structural integrity to integrated diode assembly 100 as well as additional insulation. For example, adjacent rows of photovoltaic cells may have stray wires of their interconnecting wire network extending towards another row.

Cutouts 104 may have corresponding folding cut portions 106, which are also referred to as flaps. Folding cut portions 106 are portions of insulating strip 102 that are partially separated from insulating strip 120 when corresponding cutouts 104 are formed. Keeping folding cut portions 106 attached to insulating strip 102 helps to prevent contamination during fabrication (i.e., attached pieces vs. loose pieces). Furthermore, folding cut portions 106 may be used to provide mechanical support to interconnecting conductors 120. Specifically, after interconnecting conductors 120 are positioned on insulating strip 102, folding cut portions 106 may be folded over interconnecting conductors 120 and attached to interconnecting conductors 120. Additionally, when folding cut portions 106 are folded over interconnecting conductors 120, these portions may prevent encapsulant from oozing into the contact area between interconnecting conductors 120 and photovoltaic cells.

Integrated diode assembly 100 includes one or more combined diode-lead assemblies 112. When multiple assemblies are used, these assemblies are arranged along the length of integrated diode assembly 100 (the Y direction) and electrically connected to each other using interconnecting conductors 120. Combined diode-lead assembly 112 may include a diode 114 and two diode conductors 117 and 118 attached to different electrical leads of diode 114. Such combined diode-lead assemblies 112 may be referred to as "bow ties" because of their shape. However, it should be understood that combined diode-lead assemblies 112 may be formed into any other shape. Diodes 114 are rated to protect specific configurations and arrangements of photovoltaic cells as further described below.

Connections between diode 114 and one or both of diode conductors 117 and 118 may include expansion joints. An expansion joint is configured to reduce a stress applied to diode 114 by the respective diode conductor 117, 118. It has been found that excessive stresses generated during fabrication and/or operation of a module may impair the electrical performance of diode 114. Such stresses may have many sources. For example, forces attending lamination of the integrated diode assembly may induce a bending movement and a compressive stress on a diode that may be sufficient to fracture a diode, because die-attachment strips attached to a diode may not rest in the same plane. Also, shear forces applied to a diode may be induced by a mismatch in the coefficient of thermal expansion between a silicon diode and long die-attachment strips made primarily of copper that may be sufficient to fracture a diode. Even if a diode is not fractured by the stresses, the stresses may be sufficient to cause delamination at the diode attachment, which results in hot spots that can lead to diode failure. Specifically, hot spots can cause power degradation and may result in diode failure. In addition, dislocations can be generated in the silicon die of a diode by stress, and dislocations are well known to adversely affect semiconductor junctions, which lead to anomalous diode performance and even failure. Various examples of expansion joints are described in U.S. patent application Ser. No. 12/264,712, entitled "COMBINED DIODE, LEAD ASSEMBLY INCORPORATING AN EXPANSION JOINT," filed Nov. 4, 2008, which is incorporated by reference herein in its entirety for purposes of describing expansion joints.

Diode conductors 117 and 118 overlap with interconnecting conductors 120 and, as a result, form electrical connections with interconnecting conductors 120 during fabrication of integrated diode assembly 100. Some pressure between diode conductors 117 and 118 and interconnecting conductors 120 may be initially provided by their respective attachment to insulating strip 102. Later, pressure within the module created during lamination also helps maintaining the contact. Similar to the contact area requirements described above, the overlap between diode conductors 117 and 118 and interconnecting conductors 120 may be at least about 50 millimeters square or, more specifically, at least about 100 millimeters square (e.g., 140-150 millimeters square). In certain embodiments, diode conductors 117 and 118 are welded or soldered to interconnecting conductors 120 to provide more robust and less resistive connection.

In certain embodiments, an interconnecting assembly includes two insulating strips. The second strip may be positioned over interconnecting conductors positioned on the first strip such that interconnecting conductors are shelled between the two strips. The two strips may be adhered to each other. While this two-strip embodiment may be more expensive to make, it may provide additional insulation, mechanical integrity, and various other characteristics that may not be achievable with single insulating strip embodiments.

Figure 2A:
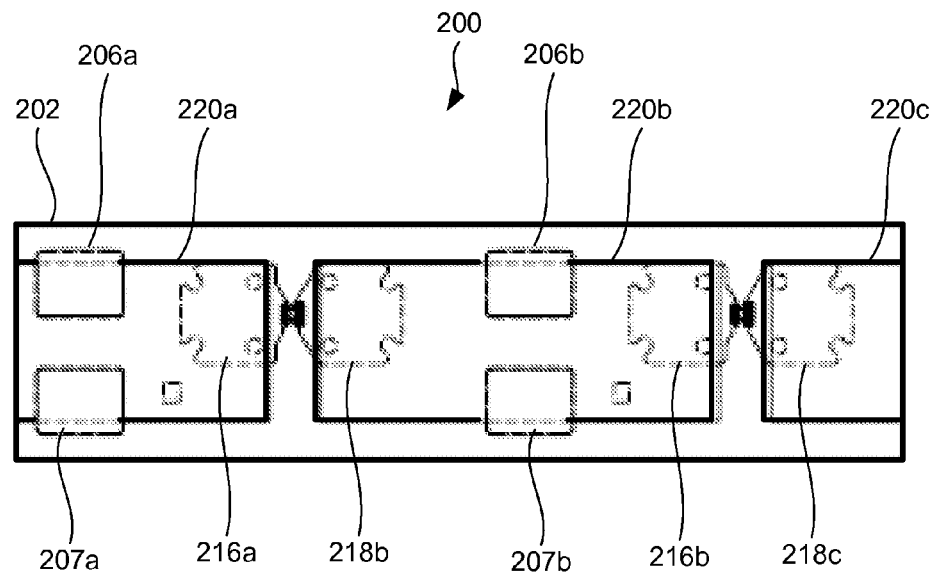
FIG. 2A illustrates a bottom view of an integrated diode assembly showing interconnecting conductors positioned over combined diode-lead assemblies and covered by folding cut portions, in accordance with certain embodiments.
Figure 2B:
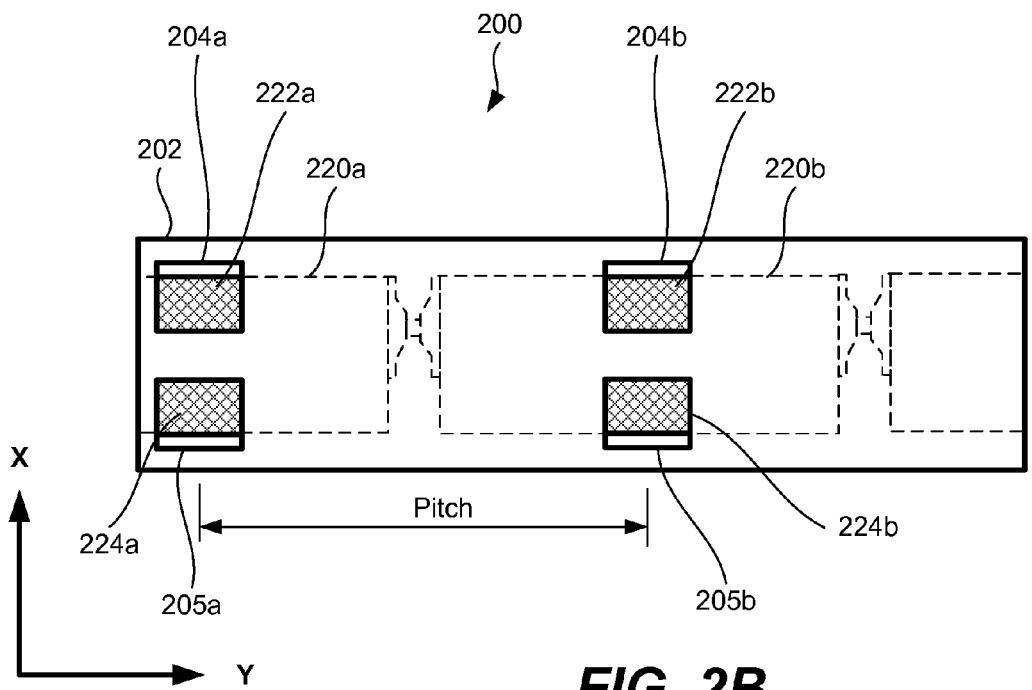
FIG. 2B illustrates a top view of the integrated diode assembly presented in FIG. 2A showing portions of interconnecting conductors visible through the cutouts, in accordance with certain embodiments.

A fully assembled integrated diode assembly 200 is illustrated in FIGS. 2A and 2B. Specifically, FIG. 2A illustrates a bottom view of integrated diode assembly 200, in accordance with certain embodiments. The side of integrated diode assembly 200 visible in this figure generally faces the back insulating sheet of the module and may contact this sheet and/or encapsulant positioned in between the sheet and integrated diode assembly 200. In the assembled state of integrated diode assembly 200, interconnecting conductors 220a, 220b, and 220c are positioned adjacent to insulating strip 202 and connect to corresponding diode conductors 216a, 218b, 216b, and 218c. Specifically, interconnecting conductor 220b connects diode conductor 218b to diode conductor 216b. Similarly, interconnecting conductors 220a and 220c may connect diode conductors 216a and 218c, respectively, to other diode conductors. In certain embodiments, interconnecting conductors positioned at one or both ends of the integrated diode assembly are only connected to one diode conductor. Folding cut portions 206a and 207a are shown being folded over interconnecting conductor 220a. In certain embodiments, folding cut portions 206a and 207a attached to interconnecting conductor 220a. Similarly, folding cut portions 206b and 207b are folded over and, in certain embodiments, attached to interconnecting conductor 220b.

FIG. 2B illustrates a top view the same integrated diode assembly 200, in accordance with certain embodiments. The side visible in this figure faces the photovoltaic cells. Insulating strip 202 forms a majority of the surface on this side. However, insulating strip 202 includes four cutouts 204a, 204b, 205a, and 205b that expose portions interconnecting conductors 220a and 220b. Specifically, cutout 204a exposes portion 222a; cutout 205a exposes portion 224a, cutout 204b exposes portion 222b, and cutout 205b exposes portion 224b. These exposed portions are configured to make electrical connections to photovoltaic cells or, more specifically, to the back side substrate surface of the photovoltaic cells. These exposed portions exposed portions are also interconnected with each other either directly, such as portion 222a and portion 224a, or through a diode, such as portions 222a and 222b. More specifically, portion 222a and portion 224a are parts of the same interconnecting conductor 220a. Similarly, portion 222b and portion 224b are parts of the same interconnecting conductor 220b.

The spacing between two adjacent portions connected through a diode (i.e., spacing along the length of integrated diode assembly 200 in the Y direction) is referred to as a pitch. When photovoltaic cells are arranged in a row and interconnected in series, the pitch and cell width determine a number of cells in a set that is connected to one diode.

Interconnection Techniques

Figure 3A:
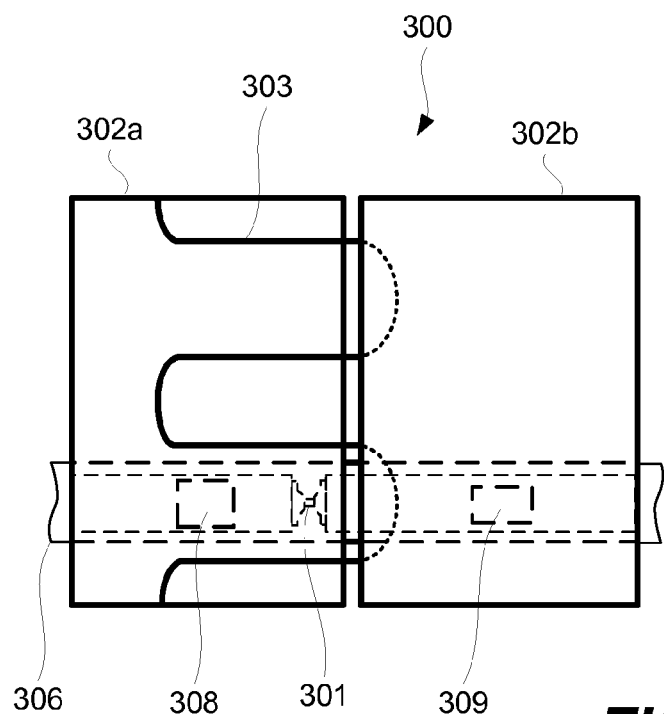
FIG. 3A illustrates a top schematic view of a photovoltaic module portion having two photovoltaic cells, in which opposite sides of the left cell are connected in parallel with a diode, in accordance with certain embodiments.

Integrated diode assemblies described above allow connecting one diode to one or more cells. These cells may be arranged in one or more sets and interconnected within these sets according to various schemes. Various connection examples will now be explained in more detail with reference to FIGS. 3A-3G. Specifically, FIG. 3A illustrates a top schematic view of a photovoltaic module portion 300 including two photovoltaic cells 302a and 302b, in which cell 302a is connected in parallel to a diode 301, in accordance with certain embodiments. Cells 302a and 302b are connected in series using a wire network 303, which extends over the front side of photovoltaic cell 302a and under the back side of photovoltaic cell 302b. An integrated diode assembly 306 has two exposed portions 308 and 309, which are connected to the back sides of photovoltaic cells 302a and 302b. Two exposed portions 308 and 309 are parts of the interconnecting conductors that connect through diode 301. Therefore, by virtue of these connections, photovoltaic cell 302a is connected in parallel to diode 301. This configuration may be referred to as "one cell per diode." The pitch between exposed portions 308 and 309 is generally about the same as the width of cells 302a and 302b.

Figure 3B:
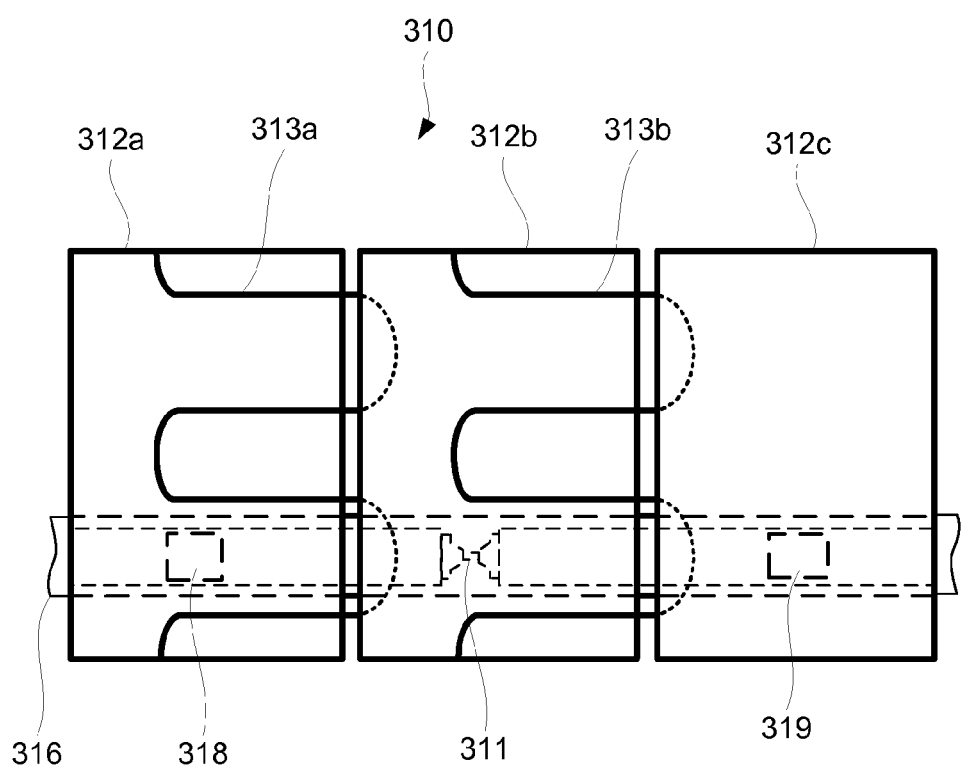
FIG. 3B illustrates a top schematic view of a photovoltaic module portion having three photovoltaic cells interconnected in series, with the two left cells also connected in parallel with a diode, in accordance with certain embodiments.

FIG. 3B illustrates a top schematic view of a photovoltaic module portion 310 having three photovoltaic cells 312a, 312b, and 312c interconnected in series, two of which (cells 312a and 312b) form a set connected in parallel to a diode 311, in accordance with certain embodiments. An integrated diode assembly 316 has two exposed portions 318 and 319, which are connected to back sides of photovoltaic cell 312a and 312c. Exposed portions 318 and 319 are parts of two different interconnecting conductors that are connected to diode 311. Photovoltaic cell 312b is insulated from these interconnecting conductors. As such, one lead of diode 311 is connected to the back side of cell 312a, while another is connected to the front side of cell 312b (i.e., though the back side of cell 312c and wire network 313b). Cells 312a and 2b are considered to be a set of two cells interconnected in series by wire network 313a that form a set. This set is connected in parallel to diode 311. This configuration may be referred to as "two cells in-series per diode." The pitch between exposed portions 318 and 319 is generally about twice the width of cells 312a through 312c.

FIG. 3C illustrates a top schematic view of a photovoltaic module portion 320 including four cells 322a-322d arranged into two rows, in which two photovoltaic cells 322a and 322c are both connected to diode 321, in accordance with certain embodiments. Two cells 322a and 322b are positioned in the top row and connected in series using a wire network 323a. Two other cells 322c and 322d are positioned in the bottom row and connected in series using another wire network 323c. An integrated diode assembly 326 has four exposed portions (i.e., portion 328a connected to the back side of photovoltaic cell 322a, portion 328b connected to the back side of photovoltaic cell 322b, portion 328c connected to the back side of photovoltaic cell 322c, and portion 328d connected to the back side of photovoltaic cell 322d. Portions 328a and 328c are parts of the same interconnecting conductor, while portions 328b and 328d are parts of another interconnecting conductor. The two conductors are connected to each other through diode 321. Therefore, the back side of cell 322a is connected through the left interconnecting conductor to the back side of the cell 322c. At the same time, the front side of cell 322a is connected to the front side of cell 322c through a chain of the following components: wire network 323a, the back side of cell 322b, right interconnecting conductor, the back side of cell 322d, and wire network 323c. Furthermore, the back sides of cells 322a and 322c are collectively connected to the front sides of cells 322b and 322d through diode 321 in a configuration that may be referred to as "two cells in-parallel per diode."

FIG. 3D illustrates a top schematic view of a photovoltaic module portion 330, in which four photovoltaic cells 332a, 332b, 332d and 322e are protected by diode 331, in accordance with certain embodiments. This configuration may be referred to as a "four cells per diode, two in-parallel/two in-series." Specifically, photovoltaic cells 332a and 332b are interconnected in series using wire network 333a and form one set. This set is connected in parallel to diode 331 in a manner similar to the one described above with reference to FIG. 3B. Likewise, photovoltaic cells 332d and 332e are interconnected in series using wire network 333d and form another set. This set is also connected in parallel to diode 331. The electrical connections in this module can be understood from a corresponding electrical diagram 340, as presented in FIG. 3E.

Figure 3F:
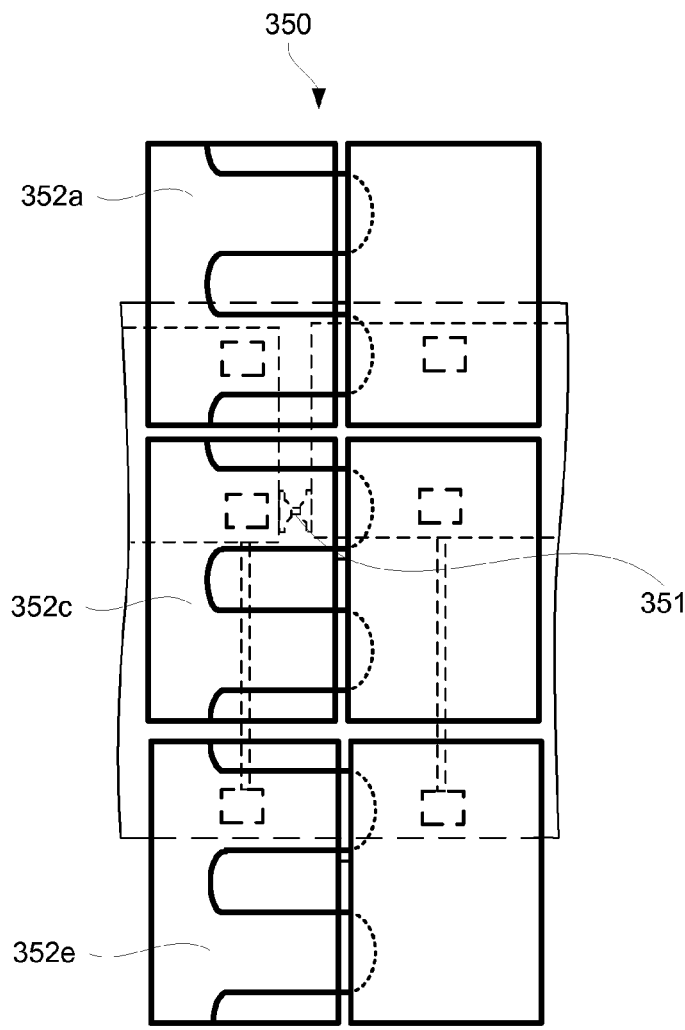
FIG. 3F illustrates a top schematic view of a photovoltaic module portion having six photovoltaic cells arranged in three rows, such that the three left cells and a diode are interconnected in parallel, in accordance with certain embodiments.
Figure 3G:
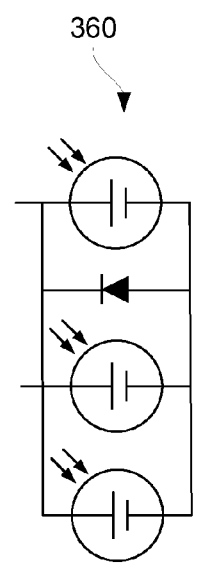
FIG. 3G is an electrical diagram corresponding to the module illustrated in FIG. 3F.

FIG. 3F illustrates a top schematic view of a photovoltaic module portion 350, in which three photovoltaic cells 352a, 352c, and 352e are protected by diode 351, in accordance with certain embodiments. This configuration may be referred to as "three cells in parallel per diode." The electrical connections in this module can be understood from a corresponding electrical diagram 360 presented in FIG. 3G. Photovoltaic module portion 350 is similar to a module portion shown in FIG. 3C and described above with another third row of cells added at the bottom. This row includes two cells, the back sides of which are also connected to the two interconnecting conductors. These connections may be made by leads extending under the middle row. The leads may or may not be supported by the same insulating strip. In certain embodiments (not shown), exposed contact portions contacting all three cells are parts of the same interconnecting conductor.

Figure 4A:
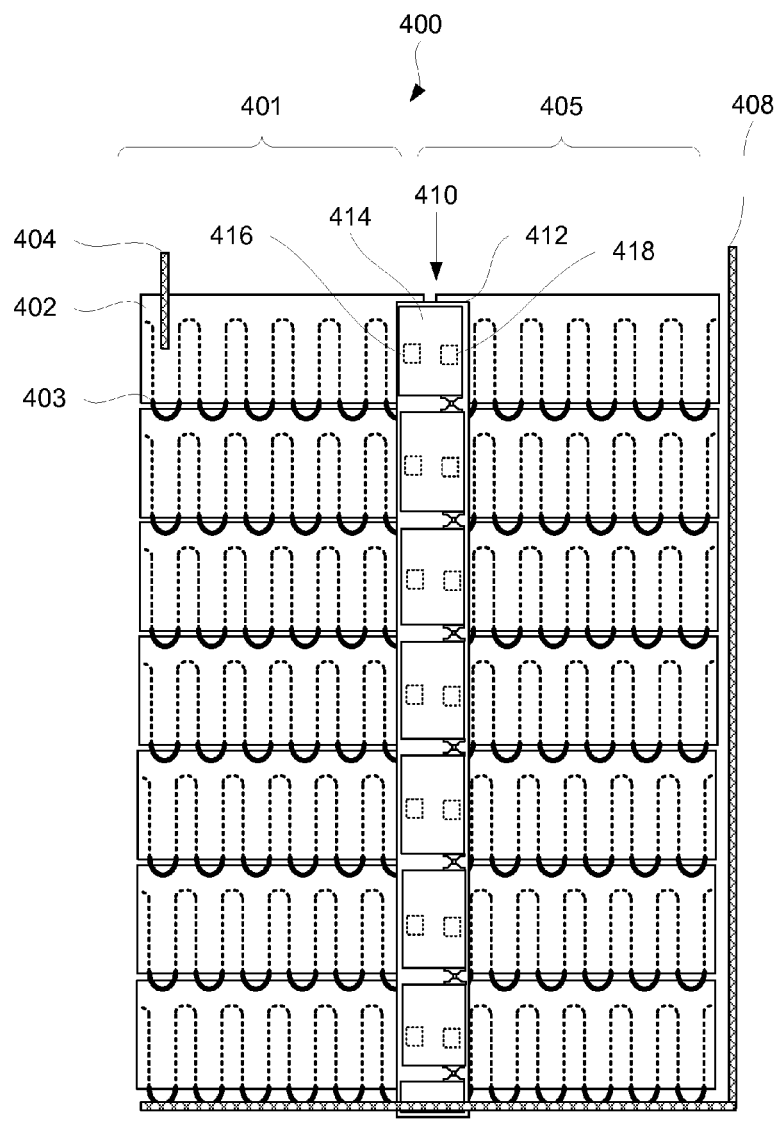
FIG. 4A illustrates a bottom schematic view of a photovoltaic module, in which two rows of cells are connected to one integrated diode assembly, in accordance with certain embodiments.
Figure 4B:
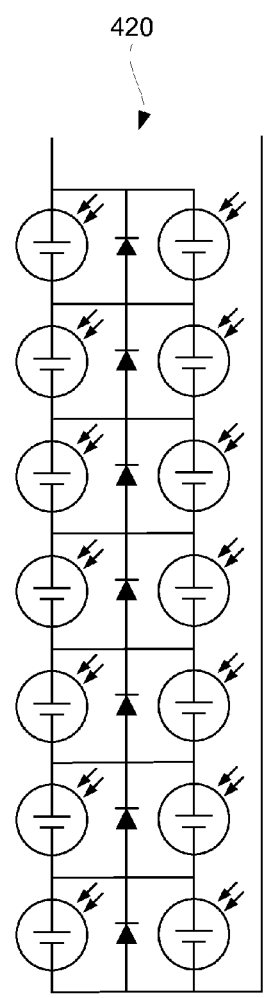
FIG. 4B is an electrical diagram corresponding to the module illustrated in FIG. 4A.

FIGS. 3A-3D and 3F described above illustrate only parts of photovoltaic modules to provide a better understanding of various interconnection schemes using integrated diode assemblies. A more comprehensive overview of the entire photovoltaic modules and assemblies will now be described with reference to FIGS. 4A-4F. Specifically, FIG. 4A is a bottom schematic view of a photovoltaic module 400, in which two rows of cells 401 and 405 are connected to one integrated diode assembly 410, in accordance with certain embodiments. Integrated diode assembly 410 includes multiple interconnecting conductors 414. Each conductor 414 is connected to the back sides of two cells (i.e., one cell from each row) through two cutouts 416 and 416 in insulating strip 412 forming respective contact areas. Furthermore, each cell is connected to one conductor 414. In each row, cells 402 are also interconnected in series using wire networks 403. The back sides of top cells are connected to a bus bar 404 either directly (the left cell) or through the top interconnecting conductor (the right cell). Furthermore, the bottom wire networks are connected to another bus bar 408. FIG. 4B is an electrical diagram 420 corresponding to module 400.

FIG. 4C is a bottom schematic view of another photovoltaic module 430, in which two rows of cells 431 and 435 are also connected to one integrated diode assembly 440, in accordance with different embodiments. The main difference between module 400 described above and module 430 is that integrated diode assembly 440 is not connected to all cells, but to every other cell. Specifically, top interconnecting conductor 444a is connected to the back sides of the two top cells (one in each row). The lower interconnecting conductor 444b is connected to the back sides of the third cells (counting from the top; also one cell in each row). The second cells (in between the top and third cells) are not connected to interconnecting conductors. Instead, these cells are connected in series with other cells in their respective rows. The connections in this module are according to the "four cells per diode, two in-parallel/two in-series" scheme described above with reference to FIGS. 3D and 3E. FIG. 4D is an electrical diagram 450 corresponding to module 430.

FIG. 4E is a bottom schematic view of yet another photovoltaic module 460 having two cell rows 461 and 462, in which each row is connected to a separate integrated diode assembly, in accordance with different embodiments. Specifically, row 461 is connected to an integrated diode assembly 471, while row 462 is connected to an integrated diode assembly 472. The connections in this module are according to the "two cells in series per diode" scheme described above with reference to FIG. 3B. FIG. 4F is an electrical diagram 480 corresponding to module 460.

Processing Techniques

Figure 5:
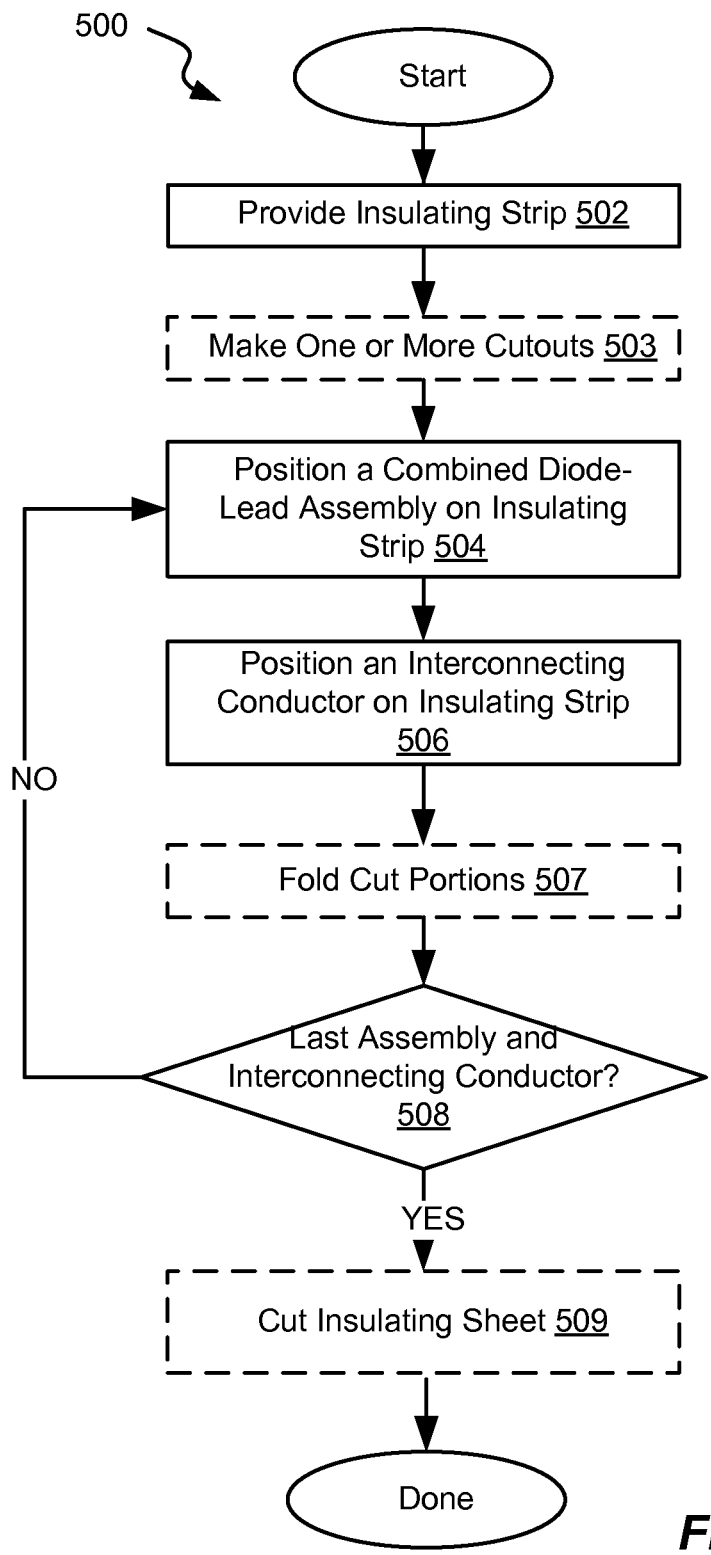
FIG. 5 is a process flowchart corresponding to a method of fabricating an integrated diode assembly, in accordance with certain embodiments.

FIG. 5 is a process flowchart corresponding to a method 500 of fabricating an integrated diode assembly, in accordance with certain embodiments. Method 500 may start with providing an insulating strip in operation 502. Various examples of insulating strips are described above with reference to FIG. 1. Insulating strips provided in this operation may be integrated into a larger sheet containing other insulating strips and may even be a continuous film. This sheet or film is later cut into individual insulating strips as further described below Method 500 may involve an optional operation 503 during which one or more cutouts are formed in the insulating strip. A die cutter may be used for this purpose. The cutouts may be formed such that corresponding folding cut portions remain attached to the insulating strip. In certain embodiments, an insulating strip provided in operation 502 has prefabricated cutouts and operation 503 is not performed. Cutouts and, more specifically, folding cut portions may be formed at any time during the overall fabrication process prior to positioning one or more interconnecting conductors on the insulating strip.

Method 500 may proceed with positioning a combined diode-lead assembly on the insulating strip during operation 504. The combined diode-lead assembly may be picked and placed by a robotic arm. The alignment may be controlled using special alignment features provided in the insulating strip and/or using as references other components of the assembly, such as edges of the insulating strip, cutouts, and/or previously positioned combined diode-lead assemblies. At least one combined diode-lead assembly is positioned on the insulating strip prior to positioning any interconnecting conductors, since the diode conductors are configured to extend between the insulating strip and the interconnecting conductor. Some interconnecting conductors are used to interconnect two combined diode-lead assemblies, while others (e.g., interconnecting conductors positioned at one or both ends of the assembly) are used to make connections to only one combined diode-lead assembly.

After aligning the combined diode-lead assembly on the insulating strip, the combined diode-lead assembly may be attached to the strip in order to maintain this alignment during later fabrication operations and even after fabrication. A surface of the insulating strip contacting the combined diode-lead assembly may have some initial tackiness to provide this attachment. Furthermore, a portion of the combined diode-lead assembly may be heated to melt or at least increase tackiness of the surface and form the attachment. Some pressure may be provided in addition or instead of heating. These attachment techniques may be accomplished by a robotic arm used to pick and place the combined diode-lead assembly.

Method 500 then proceeds with positioning an interconnecting conductor onto the insulating strip during operation 506. A portion of the interconnecting conductor overlaps with at least one diode conductor to make an electrical contact with the diode. In certain embodiments, an interconnecting conductor overlaps with two diode conductors, which also interconnects two diodes. The interconnecting conductor may be attached to the insulating strip using one or more techniques described above.

During positioning of the interconnecting conductor onto the insulating strip, the cut portions of the insulated strip are folded away from the cutouts to ensure that the interconnecting conductor is fully accessible through the cutouts. In a later optional operation 507, these cut portions may be folded over the interconnecting conductor (i.e., over the side of the interconnecting conductor opposite of the insulating strip). The cut portions may be also attached to the interconnecting conductor by various attachment techniques described above.

The integrated diode assembly may include multiple combined diode-lead assemblies and interconnecting conductors and operations 504, 506, and 507 may be repeated until all necessary components are positioned on the insulation strip as indicated by a decision block 508. In certain embodiments, after all electrical components are positioned on the insulating strip, another insulating strip is provided over the first strip and the entire assembly is laminated. However, a single insulating strip may be also used as a carrier for all electrical components.

Method 500 may proceed with an optional operation 509 during which the insulating strip with all electrical components positioned on it is cut to width and/or to length. As stated above, having integrated insulating strips during previous operations simplifies the handling and alignment of various components. Cutting may be performed by various slitters, such as roller cutters.

Figure 6:
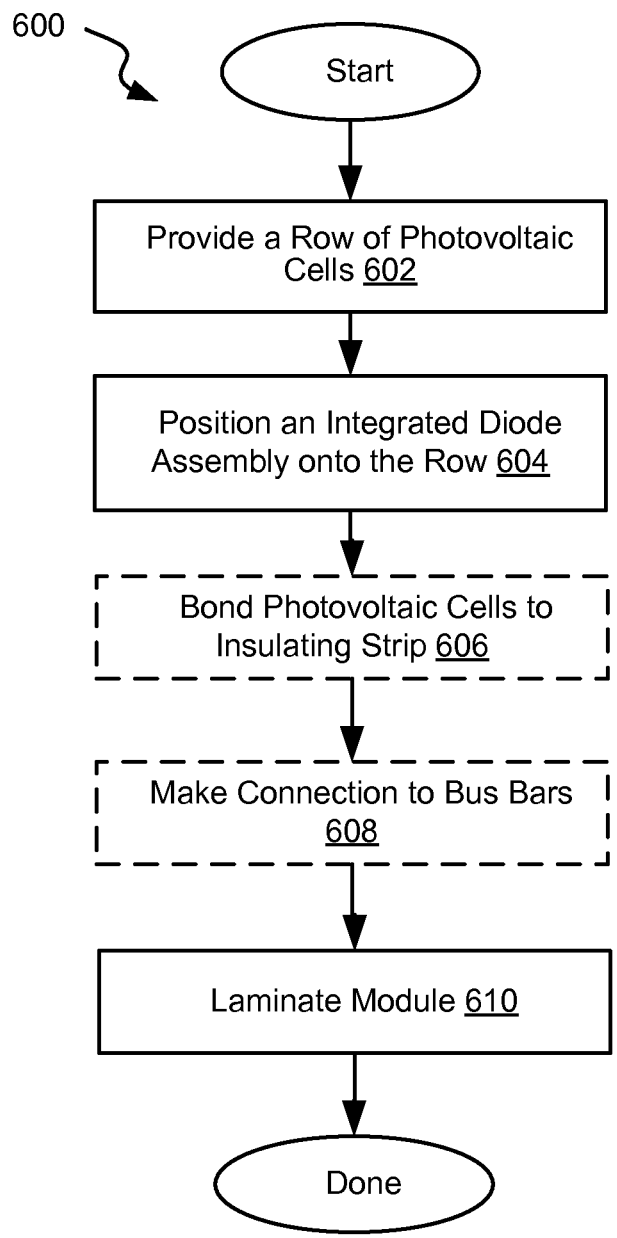
FIG. 6 is a process flowchart corresponding to a method of fabricating a photovoltaic module using one or more integrated diode assemblies, in accordance with certain embodiments.

FIG. 6 is a process flowchart corresponding to a method 600 of fabricating a photovoltaic module using one or more integrated diode assemblies, in accordance with certain embodiments. Method 600 may start with providing one or more rows of aligned and interconnected photovoltaic cells during operation 602. The cells may be interconnected in-series, although other interconnecting schemes may be used as well. Multiple rows of cells may be connected to each other using bus bars. The cells may be positioned on a front sealing sheet or, more specifically, on an encapsulant layer provided over the front sealing sheet. The encapsulant layer may help maintain alignment of the cells during later operations. The back substrate sides of the cells may face upwards and be used for receiving one or more integrated diode assemblies in later operations.

Method 600 then proceeds with positioning one or more integrated diode assemblies over these back substrate sides during operation 604. One integrated diode assembly may be shared by two or more adjacent rows of cells as described above. In other embodiments, each row of cells has a dedicated integrated diode assembly. An integrated diode assembly is positioned with its insulating strip facing the cells. The cutouts of the assembly are aligned with specific cells to make electrical connections to these cells.

Method 600 may also involve an optional operation 606 during which the photovoltaic cells are bonded to the insulating strip of the integrated diode assembly. This bond helps to maintain the initial alignment of the cells during later processing (e.g., in addition to encapsulant layers), particularly during lamination when the cells tend to be pushed in different directions. Bonding of the cells to the insulating strip may involve localized heating of the cells and/or the insulating strip. Prior to enclosing the module, certain electrical connections may be established in an optional operation 608. For example, one or more interconnecting conductors positioned at the ends of the integrated diode assembly may be connected to one or more respective bus bars.

At a certain point in the overall process, the module is enclosed and laminated during operation 610. This operation may involve positioning another encapsulant layer over the cells and one or more integrated diode assemblies and then positioning a back side insulating sheet. In certain embodiments, the insulating sheet is positioned directed onto the cells without an intermediate encapsulant layer. The entire stack of various module components may be then heated and subjected to pressure in order to flow the encapsulant within the module and eliminate any gaps or pockets, and to bond the encapsulant to other components, such as sealing sheets, cells, and integrated diode assembly. This operation may also help form bonds between the back side encapsulant, if one is provided, and the one or more integrated diode assemblies.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. An integrated diode assembly for providing electrical protection to one or more photovoltaic cells in a photovoltaic module, the integrated diode assembly comprising:

an insulating strip comprising a first surface, a second surface, and a first cutout;

a first combined diode-lead assembly disposed adjacent to the second surface and comprising a first diode, a first diode conductor electrically connected to one electrical lead of the first diode, and a second diode conductor electrically connected another electrical lead of the first diode; and a first interconnecting conductor disposed adjacent to the second surface, the first interconnecting conductor at least partially overlapping and being electrically connected to the first diode conductor, wherein one or more of the first interconnecting conductor and the first diode conductor at least partially overlap the first cutout to provide an electrical connection to a first photovoltaic cell disposed adjacent to the first surface.

2. The integrated diode assembly of claim 1, wherein one or more of the first interconnecting conductor and the first diode conductor at least partially overlap the first cutout to provide an electrical connection to a second photovoltaic cell disposed adjacent to the first surface and to the first photovoltaic cell.

3. The integrated diode assembly of claim 1, wherein the insulating strip further comprises a second cutout at least partially overlapped by one or more of the first interconnecting conductor and the first diode conductor to provide an electrical connection to a second photovoltaic cell disposed adjacent to the first surface of the insulating strip and to the first photovoltaic cells.

4. The integrated diode assembly of claim 1, further comprising a second interconnecting conductor disposed adjacent to the second surface, the second interconnecting conductor at least partially overlapping and being electrically connected to the second diode conductor, wherein one or more of the second interconnecting conductor and the second diode conductor at least partially overlap a second cutout provided on the insulating strip to provide an electrical connection to a second photovoltaic cell disposed adjacent to the first surface.

5. The integrated diode assembly of claim 4, wherein a distance between the first cutout and the second cutout is such that the first photovoltaic cell is adjacent to the second photovoltaic cell.

6. The integrated diode assembly of claim 4, wherein a distance between the first cutout and the second cutout is such that the first photovoltaic cell is separated by at least one other photovoltaic cell from the second photovoltaic cell.

7. The integrated diode assembly of claim 4, wherein the first diode-lead assembly is positioned between the first cutout and the second cutout.

8. The integrated diode assembly of claim 1, further comprising a second combined diode-lead assembly disposed adjacent to the second surface of the insulating strip, the second diode-lead assembly comprising a second diode, a third diode conductor electrically connected to one electrical lead of the second diode, and a forth diode conductor electrically connected to another electrical lead of the second diode, the first interconnecting conductor at least partially overlapping and being electrically connected to the fourth diode conductor.

9. The integrated diode assembly of claim 1, wherein the insulating strip comprises a folding cut portion formed by the first cutout, the folding portion attached to an opposite surface of the interconnecting conductor with respect to the first cutout.

10. The integrated diode assembly of claim 1, wherein an electrical connection between the first diode conductor and the first diode comprises an expansion joint configured to reduce stress applied to the first diode.

11. The integrated diode assembly of claim 10, wherein the expansion joint is configured to provide a sliding contact in communication with the interconnecting conductor.

12. The integrated diode assembly of claim 1, wherein the insulating strip comprises an adhesive layer provided on the second surface, the adhesive layer configured to provide mechanical support to the first combined diode-lead assembly and/or to the first interconnecting conductor.

13. The integrated diode assembly of claim 12, wherein the adhesive layer comprises one or more adhesive materials selected from the group consisting of a pressure sensitive adhesive and a hot-melt adhesive.

14. The integrated diode assembly of claim 12, wherein the insulating strip comprises a second adhesive layer provided on the first surface, the first adhesive layer configured to attach to a back side of the first photovoltaic cell.

15. A photovoltaic module comprising:
a first row of photovoltaic cells interconnected in series, the first row comprising a first photovoltaic cell and a second photovoltaic cell; and
an integrated diode assembly provided adjacent to and overlapping with the first row of photovoltaic cells, the integrated diode assembly comprising:
an insulating strip comprising a first cutout aligned with the first photovoltaic cell and a second cutout aligned with the second photovoltaic cell; and
a first combined diode-lead assembly provided adjacent to an opposite side of the insulating strip with respect to the first row of photovoltaic cells,
the first diode-lead assembly comprising a first diode, a first diode conductor electrically connected to one electrical lead of the first diode and to a back side of the first photovoltaic cell, and a second diode conductor electrically connected to another electrical lead of the first diode and to a back side of the second photovoltaic cell.

16. The photovoltaic module of claim 15, further comprising a first interconnecting conductor disposed adjacent to the opposite side of the insulating strip with respect to the first row of photovoltaic cells,
the first interconnecting conductor at least partially overlapping with the first cutout and being electrically connected to the back side of the first photovoltaic cell,
the first interconnecting conductor at least partially overlapping the first diode conductor and being electrically connected to the first diode conductor.

17. The photovoltaic module of claim 15, further comprising a second interconnecting conductor disposed adjacent to the opposite side of the insulating strip with respect to the first row of photovoltaic cells,
the second interconnecting conductor at least partially overlapping with the second cutout and being electrically connected to the back side of the second photovoltaic cell,
the second interconnecting conductor at least partially overlapping the second diode conductor and being electrically connected to the second diode conductor.

18. The photovoltaic module of claim 15, wherein the first photovoltaic cell is adjacent to the second photovoltaic cell in the first row.

19. The photovoltaic module of claim 15, wherein the first photovoltaic cell is separated from the second photovoltaic cell by at least one other photovoltaic cell in the first row.

20. The photovoltaic module of claim 15, further comprising a second row of photovoltaic cells interconnected in series, the second row comprising a third photovoltaic cell and fourth photovoltaic cell, wherein a back side of the third photovoltaic cell is electrically connected to the first diode conductor; and wherein a back side of the fourth photovoltaic cell is electrically connected to the second diode conductor.

21. The photovoltaic module of claim 20, wherein the integrated diode assembly is provided adjacent to and overlaps with the second row of photovoltaic cells.

22. The photovoltaic module of claim 21, wherein the back side of the third cell overlaps with the first cutout.

23. The photovoltaic module of claim 21, wherein the back side of the third cell overlaps with a third cutout provided in the insulating strip, and wherein a first interconnecting conductor is disposed adjacent to the opposite side of the insulating strip with respect to the first row of photovoltaic cells and with respect to the second row of photovoltaic cells, the first interconnecting conductor and/or the first diode conductor at least partially overlapping with the first cutout and being electrically connected to the back side of the first photovoltaic cell and at least partially overlapping with the third cutout and being electrically connected to the back side of the third photovoltaic cell, the first interconnecting conductor at least partially overlapping the first conductor of the first combined diode-lead assembly and being electrically connected to the first conductor.

24. The photovoltaic module of claim 20, wherein the first photovoltaic cell is separated from the second photovoltaic cell by at least one other photovoltaic cell in the first row; and wherein the third photovoltaic cell is separated from the fourth photovoltaic cell by at least one other photovoltaic cell in the second row.

25. The photovoltaic module of claim 15, wherein the insulating strip is adhered to the back side of the first photovoltaic cell and to the back side of the second photovoltaic cell.

26. The photovoltaic module of claim 15, further comprising a back side insulating sheet, wherein the integrated diode assembly is positioned between the first row of photovoltaic cells and the back side insulating sheet.

27. The photovoltaic module of claim 15, further comprising a bus bar connected to the first diode conductor.

28. A photovoltaic module comprising:
one or more rows of photovoltaic cells, the photovoltaic cells interconnected in series in each row; and
an integrated diode assembly provided adjacent to and overlapping with the one or more rows of photovoltaic cells, the integrated diode assembly comprising:
a diode,
a first diode conductor electrically connected to one electrical lead of the diode and to a back side of a first photovoltaic cell in the one or more rows,
and a second diode conductor electrically connected to another electrical lead of the diode and to a back side of a second photovoltaic cell,
wherein electrical connections between the first photovoltaic cell and the second photovoltaic cell connect a set of multiple photovoltaic cells in parallel with the first diode.

29. A method of fabricating an integrated diode assembly for electrical coupling to multiple photovoltaic cells, the method comprising:
providing an insulating strip having a first surface, second surface and first cutout;
attaching a first combined diode-lead assembly to the second surface, the first diode-lead assembly comprising a first diode, a first diode conductor electrically connected to one electrical lead of the first diode, and a second diode conductor electrically connected another electrical lead of the first diode; and
attaching a first interconnecting conductor to the second surface of the insulating strip such that the first interconnecting conductor at least partially overlaps the first diode conductor and electrically connects to the first diode conductor, wherein one or more of the first interconnecting conductor and the first diode conductor at least partially overlap the first cutout to provide an electrical connection to a first photovoltaic cell disposed adjacent to the first surface.

30. The method of claim 29, further comprising, prior to attaching the first interconnecting conductor to the insulating sheet, forming the first cutout in the insulating strip.

31. The method of claim 30, further comprising folding one or more cut portions over the first interconnecting conductor and attaching the folded one or more cut portions to the first interconnecting conductor, wherein the one or more cut portions are formed during forming the first cutout in the insulating strip.

32. The method of claim 31, wherein attaching one or more cut portions to the first interconnecting conductor comprises heating the first interconnecting conductor.

33. The method of claim 29, wherein attaching the first interconnecting conductor comprises forming an electrical connection between the first diode conductor and a third diode conductor of a second combined diode-lead assembly attached to the insulating strip by overlapping the first interconnecting conductor with the third diode conductor.

34. The method of claim 29, wherein attaching the first interconnecting conductor comprises localized heating of a portion of the first interconnecting conductor to modify the second surface of the insulated strip.

35. The method of claim 34, wherein the second surface of the insulated strip comprises an adhesive material that increased its tackiness characteristics when heated through the first interconnecting conductor.

36. The method of claim 29, further comprising cutting the insulated strip along its width to separate the integrated diode assembly from one or more other integrated diode assemblies.

37. The method of claim 29, further comprising attaching a second combined diode-lead assembly to the second surface and attaching a second interconnecting conductor to the second surface such that the second interconnecting conductor at least partially overlaps the first diode conductor and electrically connects the first diode conductor to the second combined diode-lead assembly.

38. A method of fabricating a photovoltaic module, the method comprising:
providing an aligned row of photovoltaic cells interconnected in series, the aligned row comprising a first photovoltaic cell and a second photovoltaic cell; and
positioning an integrated diode assembly over the aligned row of photovoltaic cells such the integrated diode assembly is adjacent to and overlapping with the aligned row,
the integrated diode assembly comprising a combined diode-lead assembly and an insulating strip positioned in between the combined diode-lead assembly and the aligned row of photovoltaic cells,
the combined diode-lead assembly comprising a first diode, a first diode conductor electrically connected to one electrical lead of the first diode and to a back side of the first photovoltaic cell, and a second diode conductor electrically connected to another electrical lead of the first diode and to a back side of the second photovoltaic cell, wherein electrical connections between the first photovoltaic cell and the second photovoltaic cell connect a set of multiple photovoltaic cells in parallel with the first diode.

39. The method of claim 38, wherein the first photovoltaic cell is separated from the second photovoltaic cell by at least one or more other photovoltaic cells in the aligned row.

40. The method of claim 38, further comprising bonding the insulating strip to the back side of the first photovoltaic cell and the back side of the second photovoltaic cell.

41. The method of claim 40, wherein bonding comprises applying pressure and/or heat between the back side of the first photovoltaic cell and the back side of the second photovoltaic cell.

42. The method of claim 40, wherein bonding preserves alignment of the first photovoltaic cell with respect to the second photovoltaic cell during one of more subsequent operations.

43. The method of claim 42, wherein the one of more subsequent operations comprise lamination.

44. The method of claim 38, further comprising electrically connecting the first diode conductor to a bus bar of the photovoltaic module.

* * * * *